US006785852B2

(12) United States Patent
Okamoto et al.

(10) Patent No.: US 6,785,852 B2
(45) Date of Patent: Aug. 31, 2004

(54) MEMORY DEVICE REDUNDANT REPAIR ANALYSIS METHOD, RECORDING MEDIUM AND APPARATUS

(75) Inventors: Shinya Okamoto, Tokyo (JP); Yasuhiko Fukushima, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 489 days.

(21) Appl. No.: 09/912,534

(22) Filed: Jul. 26, 2001

(65) Prior Publication Data

US 2002/0095630 A1 Jul. 18, 2002

(30) Foreign Application Priority Data

Jan. 18, 2001 (JP) .................................. 2001-010249

(51) Int. Cl.[7] .............................................. G11C 29/00
(52) U.S. Cl. ..................... 714/710; 714/723; 365/201
(58) Field of Search ............................... 714/710, 718, 714/711, 722, 723; 365/200, 201

(56) References Cited

U.S. PATENT DOCUMENTS

| 5,867,435 | A | * | 2/1999 | Ogino ........................ 365/200 |
| 6,096,093 | A | * | 8/2000 | Caywood et al. ............. 716/21 |
| 6,108,797 | A | * | 8/2000 | Lin et al. ....................... 714/8 |
| 6,178,549 | B1 | * | 1/2001 | Lin et al. ..................... 717/124 |
| 6,320,812 | B1 | * | 11/2001 | Cook et al. ............. 365/230.03 |
| 6,345,004 | B1 | * | 2/2002 | Omura et al. ................ 365/200 |
| 6,374,378 | B1 | * | 4/2002 | Takano et al. ............... 714/719 |
| 6,442,724 | B1 | * | 8/2002 | Augarten .................... 714/738 |
| 6,536,005 | B1 | * | 3/2003 | Augarten .................... 714/723 |
| 6,594,788 | B1 | * | 7/2003 | Yasui .......................... 714/710 |
| 6,651,202 | B1 | * | 11/2003 | Phan ........................... 714/733 |

FOREIGN PATENT DOCUMENTS

JP 10-064294 3/1998

OTHER PUBLICATIONS

"Linear Search Algorithm for Repair Analysis With 4 Spare Row/4 Spare Column" Kwon et al. Proceedings of the Second IEEE Asia Pacific Conference on ASICs, 2000, Aug. 28–30, 2000, page(s): 269–272 Inspec Accession No. 6866813.*

* cited by examiner

Primary Examiner—Albert Decady
Assistant Examiner—Cynthia Britt
(74) Attorney, Agent, or Firm—McDermott Will & Emery LLP

(57) ABSTRACT

A memory device redundant repair analysis method, recording medium and apparatus allowing a redundant repair analysis method for a memory device with a plurality of redundant repair analysis rules. It is possible to provide a memory device redundant repair analysis method, recording medium and apparatus that allow a redundant repair analysis method for a memory device with a plurality of redundant repair analysis rules by carrying out processing of finally merging a plurality of repair codes corresponding to respective rules obtained by applying a plurality of redundant repair analysis rules into one code. It is also possible to provide a memory device redundant repair analysis method, recording medium and apparatus that allow a redundant repair analysis method for a memory device with a plurality of redundant repair analysis rules by performing processing of appending a plurality of repair codes corresponding to the respective rules obtained by applying a plurality of redundant repair analysis rules to one code after making each analysis determination.

19 Claims, 2 Drawing Sheets

MEMORY DEVICE REDUNDANT REPAIR ANALYSIS METHOD, RECORDING MEDIUM AND APPARATUS

BACKGROUND OF THE INVENTION

1. Field of the Invention

The present invention relates to a memory device redundant repair analysis method, recording medium and apparatus, and more particularly, to a memory device redundant repair analysis method, recording medium and apparatus that allow a repair analysis of a device including a plurality of memory units (different kinds of memory units) with a plurality of repair analysis rules.

2. Description of Related Art

In recent years, there are a variety of types of semiconductor memory devices (hereinafter simply referred to as "memory devices") and there are also a variety of types of their redundant repair analysis methods in the like manner. Among memory devices, a device including different kinds of memory units is under development and thus redundant repair analysis methods are becoming more and more complicated.

In general, memory devices repair defective chips by replacing defects by spare cells (redundant memory cells), which are owned by these chips beforehand. That is, memory devices own spare cells to repair defective memory cells beforehand and carry out redundant repair processing by replacing blocks including defective memory cells by the spare cells and using these cells and thereby converting these defective memory cells to completely good memory IC products as far as those defects are minor defects. In the redundant repair analysis processing, a redundant repair analysis apparatus determines whether a repair is possible or not based on defect information obtained by testing the memory devices first. In the case where it is determined that a repair is possible, it is necessary to specify fuse coordinates to blow a wire called a "fuse" corresponding to the address of the defective memory cell (hereinafter referred to as "defect address") through a laser trimming (LT) apparatus that heats up and fuses the wire using laser beams. For this purpose, the information such as the defect address of the defective memory cell to be repaird and spare cell used is converted to data called a "repair code" chip by chip.

The aforementioned redundant repair analysis method is carried out based on a redundant repair analysis rule specific to a memory device. However, since the conventional redundant repair analysis method can handle only one kind of redundant repair analysis rules in a test program to test memory devices, the conventional redundant repair analysis method is unable to handle repair codes when analyzed using two or more kinds of redundant repair analysis rules as a single-chip code. Thus, the conventional redundant repair analysis method has a problem of being unable to handle a redundant repair analysis for a device including a plurality of memory units and including two or more types of redundant repair analysis rules.

SUMMARY OF THE INVENTION

The present invention has been achieved to solve the above-described problem and it is an object of the present invention to provide a memory device redundant repair analysis method, recording medium and apparatus allowing a redundant repair analysis method for a memory device with a plurality of redundant repair analysis rules, particularly for a device including different kinds of memory units.

According to a first aspect of the present invention, there is provided a memory device redundant repair analysis method that performs a redundant repair analysis on a plurality of memory devices each provided with a redundant repair analysis rule to repair defective memory, comprising the steps of: a rule application step of applying a redundant analysis rule to each of a plurality of memory devices; and a compiling step of compiling results of applying the redundant analysis rule individually by the rule application step into one result.

According to a second aspect of the present invention, there is provided a recording medium that records a computer-readable program that executes the memory device redundant repair analysis method according to the present inventions.

According to a third aspect of the present invention, there is provided a memory device redundant repair analysis apparatus that performs a redundant repair analysis on a plurality of memory devices each provided with a redundant repair analysis rule to repair defective memory, comprising: rule application means for applying a redundant analysis rule to each of a plurality of memory devices; and compiling means for compiling results of the redundant analysis rule individually applied by the rule application step into one result.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

With reference now to the attached drawings, embodiments of the present invention will be explained in detail below.

First Embodiment

Figure 1:
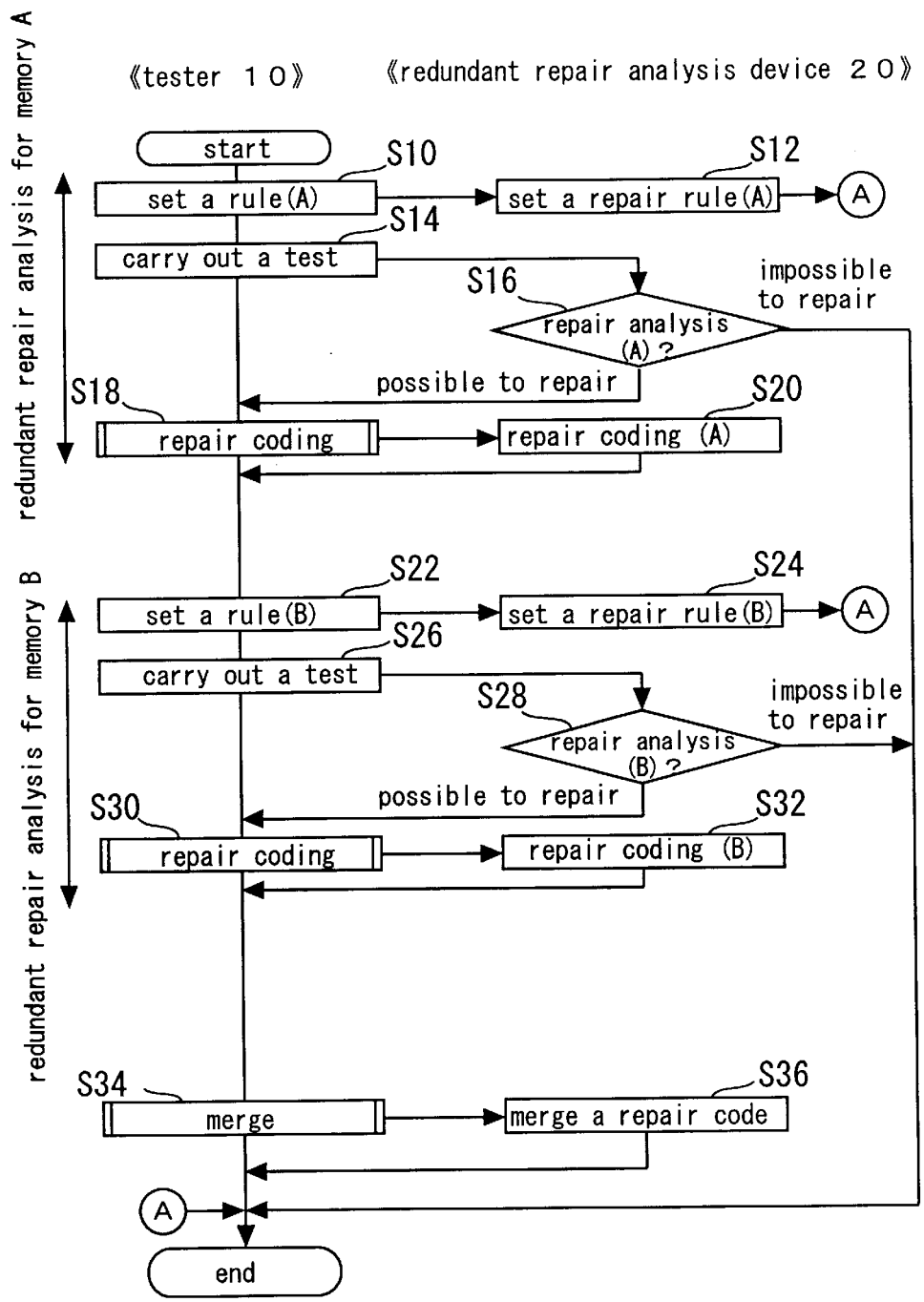
FIG. 1 shows a flow chart of a redundant repair analysis method according to First Embodiment of the present invention.

FIG. 1 shows a flow chart of a redundant repair analysis method according to First Embodiment of the present invention in a memory device provided with two kinds of memory units (hereinafter referred to as "memory A" and "memory B", respectively) and different redundant repair analysis rules for the respective memory A and memory B. That is, FIG. 1 shows a test system corresponding to a plurality of redundant repair analysis rules. The left side of FIG. 1 is a flow chart corresponding to a tester 10 that carries out a test and the right side of FIG. 1 is a flow chart corresponding to a redundant repair analysis apparatus 20 that carries out a redundant repair analysis.

As shown in FIG. 1, the tester 10 sets a memory A repair rule (step S10) before carrying out a test (step S14) and also sets this rule for the redundant repair analysis apparatus 20 (step S12). The tester 10 carries out a test on memory A (step S14), and incorporates defect address information, etc. into Fail memory (not shown) after carrying out this test. The redundant repair analysis apparatus 20 connected to the tester 10 determines whether a repair is possible or not based on this defect address information, etc. (step S16). When it is determined that a repair is possible, the tester 10 performs repair coding on the analysis result after the final test as the information to be handed over to the LT apparatus (step S18). This repair code is formatted in a desired format and stored in another storage area in the tester 10 or redundant repair analysis apparatus 20 (steps S18 and S20). When it is determined in step S16 that a repair is not possible, the redundant repair analysis apparatus 20 ends the processing. This completes the redundant repair analysis method for memory A.

Then, the same processing for memory A is carried out for memory B. That is, the tester 10 resets a memory B repair rule (step S22) before carrying out a test (step S26) and also sets this for redundant repair analysis apparatus 20 (step S24). The tester 10 carries out a test on memory B (step S26), and incorporates defect address information into Fail memory (not shown) after carrying out this test. The redundant repair analysis apparatus 20 connected to the tester 10 determines whether a repair is possible or not based on this defect address information (step S28). When it is determined that a repair is possible, the tester 10 performs repair coding on the analysis result after the final test as the information to be handed over to the LT apparatus (step S30). This repair code is formatted in a desired format and stored in another storage area in the tester 10 or the redundant repair analysis apparatus 20 (steps S30 and S32). When it is determined in step S28 that a repair is not possible, the redundant repair analysis apparatus 20 ends the processing. This completes the redundant repair analysis method for memory B.

Finally, merge processing is carried out to merge the repair codes obtained for memory A and memory B with their respective redundant repair analysis rules into one code (steps S34, S36) and the process ends. This First Embodiment describes the memory deice provided with two memories, memory A and memory B, as an example, but this is only shown for an illustrative purpose and it goes without saying that the present invention is also applicable to a case where three or more memories are incorporated. In this case, the present invention can be implemented by repeating the same processing in steps S10 to S20 by the number of desired memories after step S30 in the flow chart in FIG. 2.

Thus, according to First Embodiment, it is possible to finally merge a plurality of repair codes corresponding to the respective rules obtained by applying a plurality of redundant repair analysis rules into one code. This makes it possible to perform a redundant repair analysis on a device with different kinds of memory units a mixture and a plurality of redundant repair analysis rules for the respective memory units.

Second Embodiment

Figure 2:
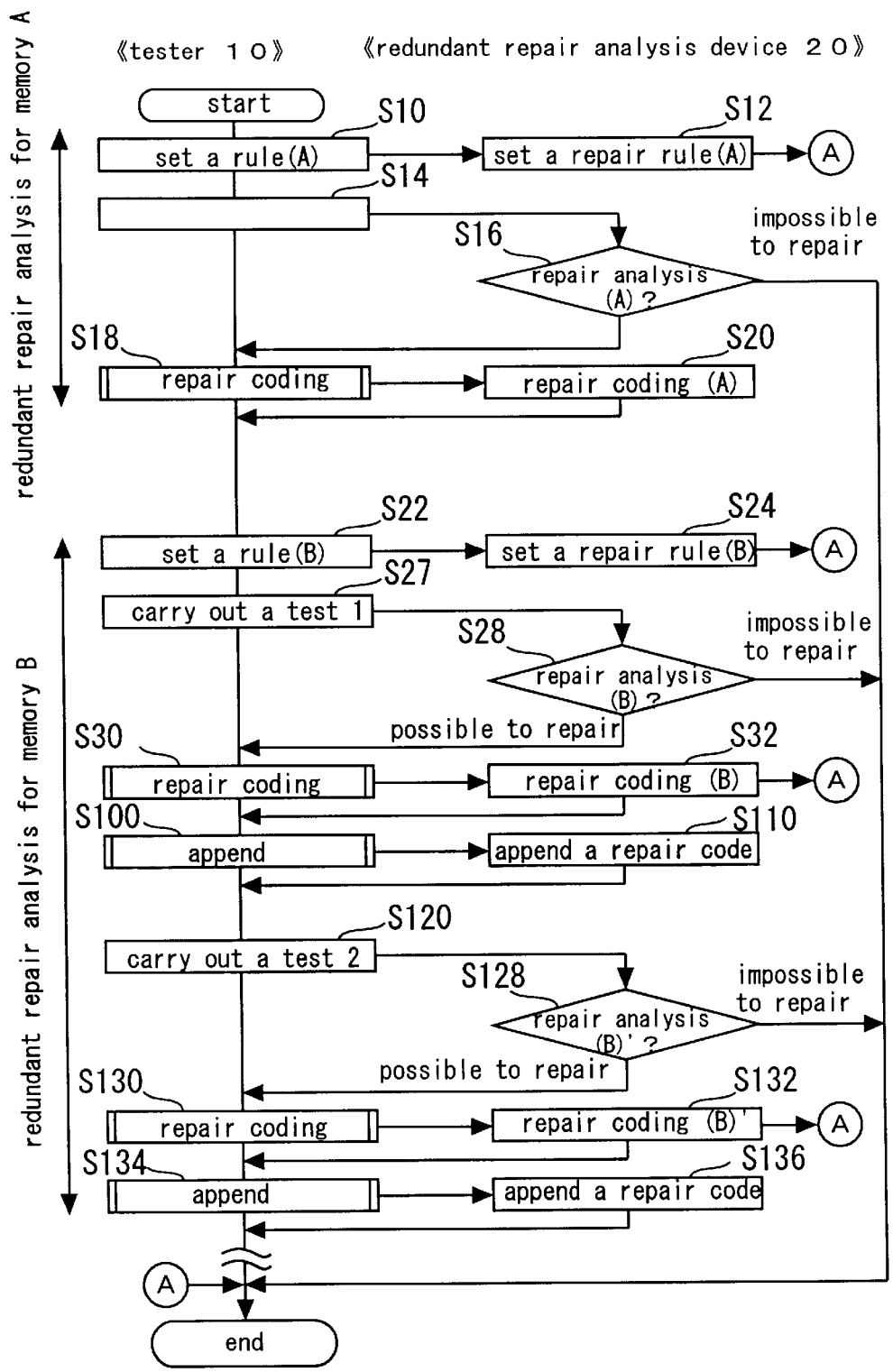
FIG. 2 shows a flow chart of a redundant repair analysis method according to Second Embodiment of the present invention.

FIG. 2 shows a flow chart of a redundant repair analysis method according to Second Embodiment of the present invention in a memory device provided with two kinds of memory with different redundant repair analysis rules. FIG. 2 shows a test system corresponding to a plurality of redundant repair analysis rules. The left side of FIG. 2 is a flow chart of the tester 10 that carries out a test and the right side of FIG. 2 is a flow chart of the redundant repair analysis apparatus 20 that carries out a redundant repair analysis. First Embodiment above performs coding for each repair rule of memory A and memory B and finally merges the obtained repair codes into one code. On the other hand, Second Embodiment uses a method of sequentially appending repair codes obtained from an analysis with the redundant repair analysis rules of the two tests of memory B to the final line of the repair code obtained from the result of an analysis of the redundant repair analysis rule of memory A.

As shown in FIG. 2, the tester 10 sets a memory A repair rule (step S10) before carrying out a test (step S14) and also sets this rule for the redundant repair analysis apparatus 20 (step S12). The tester 10 carries out a test on memory A (step S14) and incorporates defect address information, etc. into Fail memory (not shown) after carrying out this test. The redundant repair analysis apparatus 20 connected to the tester 10 determines whether a repair is possible or not based on this defect address information (step S16). When it is determined that a repair is possible, the tester 10 performs repair coding on the analysis result after the final test as the information to be handed over to the LT apparatus (step S18). This repair code is formatted in a desired format and stored in another storage area in the tester 10 or the redundant repair analysis apparatus 20 (steps S18 and S20). When it is determined in step S16 that a repair is not possible, the redundant repair analysis apparatus 20 ends the processing. This completes the redundant repair analysis method for memory A.

Then, the same processing for memory A is carried out for memory B. That is, the tester 10 resets a memory B repair rule (step S22) before carrying out test 1 (step S27) and also sets this for the redundant repair analysis apparatus 20 (step S24). The tester 10 carries out test 1 on memory B (step S27), and incorporates defect address information into Fail memory (not shown) after carrying out this test 1. The redundant repair analysis apparatus 20 connected to the tester 10 determines whether a repair is possible or not based on this defect address information (step S28). When it is determined that a repair is possible, the tester 10 performs repair coding (step S30). This repair code is formatted in a desired format and stored in another storage area in the tester 10 or the redundant repair analysis apparatus 20 (steps S30 and S32). Then, the tester 10 appends the repair code obtained in step S30 to the final line of the repair code obtained in step S18 by applying the redundant repair analysis rule of memory A to form a one repair code (step S100). Likewise, the redundant repair analysis apparatus 20 also appends the repair code obtained in step S32 to the final line of the repair code obtained in step S20 to form one repair code (step S110). In the case where it is determined in step S28 that a repair is not possible, redundant repair analysis apparatus 20 ends the processing. This completes the redundant repair analysis method of test 1 of memory B.

Then, the tester 10 carries out test 2 on memory B (step S120), and incorporates defect address information into Fail memory (not shown) after carrying out this test 2. The redundant repair analysis apparatus 20 connected to the tester 10 determines whether a repair is possible or not based on this defect address information (step S128). When it is determined that a repair is possible, the tester 10 performs repair coding (step S130). This repair code is formatted in a desired format and stored in another storage area in the tester 10 or the redundant repair analysis apparatus 20 (steps S130 and S132). Then, the tester 10 appends the repair code obtained in step S130 to the final line of the repair code appended in step S100 to form one repair code (step S134). Likewise, the redundant repair analysis apparatus 20 also appends the repair code obtained in step S132 to the final line of the repair code obtained in step S110 to form one repair code (step S136). In the case where it is determined in step S128 that a repair is not possible, the redundant repair analysis apparatus 20 ends the processing. This completes the redundant repair analysis method of test 2 of memory B.

This Second Embodiment describes the memory deice provided with two memories, memory A and memory B, as an example, but this is only shown for an illustrative purpose and it goes without saying that the present invention is also applicable to a case where three or more memories are incorporated. In this case, the present invention can be implemented by repeating the same processing in steps S22 to S100 by the number of desired memories after step S134 in the flow chart in FIG. 2.

As shown above, according to Second Embodiment, it is possible to perform processing of appending a plurality of repair codes corresponding to the respective rules obtained by applying a plurality of redundant repair analysis rules to one code after making each analysis determination. This allows a redundant repair analysis also for a device with different kinds of memory units and a plurality of redundant repair analysis rules for the respective memory units, etc. That is, Second Embodiment can eliminate the need for repair code merge processing unlike First Embodiment.

It goes without saying that the object of the present invention can be attained also by supplying a recording medium that records a computer program that implements the functions of the embodiments above to the redundant repair analysis apparatus of the present invention and allowing a computer (not shown) of the redundant repair analysis apparatus to read and execute the computer program stored in the recording medium. In this case, the computer program read from the recording medium itself implements a new function of the redundant repair analysis apparatus of the present invention and the recording medium that records the computer program constitutes the present invention. As the recording medium that records the computer program, it is possible to use a CD-ROM, floppy disk, hard disk, ROM, memory card or optical disk, etc.

As described above, the memory device redundant repair analysis method, recording medium and apparatus of the present invention can provide a memory device redundant repair analysis method, recording medium and apparatus that allow a redundant repair analysis method for a memory device with a plurality of redundant repair analysis rules by carrying out processing of finally merging a plurality of repair codes corresponding to the respective rules obtained by applying a plurality of redundant repair analysis rules into one code.

The present invention can also provide a memory device redundant repair analysis method, recording medium and apparatus that allow a redundant repair analysis method for a memory device with a plurality of redundant repair analysis rules by performing processing of appending a plurality of repair codes corresponding to the respective rules obtained by applying a plurality of redundant repair analysis rules to one code after making each analysis determination.

In the memory device redundant repair analysis method, the compiling step may merge the results of the redundant analysis rule individually applied by the rule application step after the redundant repair analysis rules have been applied to all memory units in the memory device and the results are complied.

In the memory device redundant repair analysis method, the compiling step may append the results of the redundant analysis rule individually applied by the rule application step for every application of each redundant repair analysis rule for memory units in the memory device and then the results are compiled.

In the memory device redundant repair analysis method, the memory units may include different kinds of memory units.

In the memory device redundant repair analysis apparatus, the results of the redundant analysis rule are merged after the redundant repair analysis rules have been applied to all memory units in the memory device and then the results are compiled.

In the memory device redundant repair analysis apparatus, each result of applying the redundant analysis rule are appended to a previously obtained result for every application of the respective redundant repair analysis rule for memory units in the memory device and then the results are compiled.

In the memory device redundant repair analysis apparatus, the memory units may include different kinds of memory units.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 2001-010249 filed on Jan. 18, 2001 including specification, claims, drawings and summary are incorporated herein by reference in its entirety.

What is claimed is:

1. A memory device redundant repair analysis method for performing a redundant repair analysis on a memory device to analyze the memory device for a defect in order to repair the defect with a redundant memory cell, comprising the steps of:
   a rule application step of applying two or more different redundant analysis rules to the memory device to obtain analysis results for the respective redundant analysis rules; and
   a compiling step of compiling the analysis results into one piece of information to be used for subsequent repair of the memory device.

2. The memory device redundant repair analysis method according to claim 1, wherein said compiling step merges the analysis results for the respective redundant analysis rules after all the redundant repair analysis rules have been applied to the memory device.

3. The memory device redundant repair analysis method according to claim 2, wherein said memory device includes a plurality of memory units,
   the rule application step applies the redundant analysis rules to the respective memory units to obtain analysis results for the respective memory units, and
   the compiling step merges the analysis results.

4. The memory device redundant repair analysis method according to claim 3, wherein said plurality of memory units comprises different kinds of memory units.

5. The memory device redundant repair analysis method according to claim 1, wherein said compiling step appends, every time the rule application step applies one of the redundant analysis rules to the memory unit, an analysis result for the one of the redundant analysis rules to previously obtained analysis result for another redundant analysis rule.

6. The memory device redundant repair analysis method according to claim 5, wherein said memory device includes a plurality of memory units,
   the rule application step applies the redundant analysis rules to the respective memory units to obtain analysis results for the respective memory units, and
   the compiling step appends an analysis result for a memory unit to a previously obtained analysis result for another memory unit.

7. The memory device redundant repair analysis method according to claim 6, wherein said plurality of memory units comprises different kinds of memory units.

8. The memory device redundant repair analysis method according to claim 1, wherein said memory device includes a plurality of memory units, the rule application step applies the redundant analysis rules to the respective memory units to obtain analysis results for the respective memory units, and the compiling step compiles the analysis results into the one piece of information.

9. The memory device redundant repair analysis method according to claim 8, wherein said plurality of memory units comprises different kinds of memory units.

10. A recording medium that records a computer-readable program that executes the memory device redundant repair analysis method according to claim 1.

11. A memory device redundant repair analysis apparatus for performing a redundant repair analysis on a memory device to analyze the memory device for a defect in order to repair the defect with a redundant memory cell comprising:

rule application means for applying two or more different redundant analysis rules to the memory device to obtain analysis results for the respective redundant analysis rules; and compiling means for compiling the analysis results into one piece of information to be used for subsequent repair of the memory device.

12. The memory device redundant repair analysis apparatus according to claim 11, wherein said compiling means is configured for merging the analysis results for the respective redundant analysis rules after all the redundant repair analysis rules have been applied to the memory device.

13. The memory device redundant repair analysis apparatus according to claim 12, wherein said memory device includes a plurality of memory units, the rule application means is configured for applying the redundant analysis rules to the respective memory units to obtain analysis results for the respective memory units, and the compiling means is configured for merging the analysis results.

14. The memory device redundant repair analysis apparatus according to claim 13, wherein said plurality of memory units comprises different kinds of memory units.

15. The memory device redundant repair analysis apparatus according to claim 11, wherein said compiling means is configured for appending, every time the rule application means applies one of the redundant analysis rules to the memory unit, an analysis result for the one of the redundant analysis rules to a previously obtained analysis result for another redundant analysis rule.

16. The memory device redundant repair analysis apparatus according to claim 15, wherein said memory device includes a plurality of memory units, the rule application means is configured for applying the redundant analysis rules to the respective memory units to obtain analysis results for the respective memory units, and the compiling means is configured for appending an analysis result for a memory unit to a previously obtained analysis result for another memory unit.

17. The memory device redundant repair analysis apparatus according to claim 12, wherein said plurality of memory units comprises different kinds of memory units.

18. The memory device redundant repair analysis apparatus according to claim 11, wherein said memory device includes a plurality of memory units, the rule application means is configured for applying the redundant analysis rules to the respective memory units to obtain analysis results for the respective memory units, and the compiling means is configured for compiling the analysis results into the one piece of information.

19. The memory device redundant repair analysis apparatus according to claim 18, wherein said plurality of memory units comprises different kinds of memory units.

* * * * *